United States Patent
Raghavan

(10) Patent No.: US 8,698,532 B2
(45) Date of Patent: Apr. 15, 2014

(54) GIGABIT-SPEED SLICER LATCH WITH HYSTERESIS OPTIMIZATION

(75) Inventor: Bharath Raghavan, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 149 days.

(21) Appl. No.: 12/900,986

(22) Filed: Oct. 8, 2010

(65) Prior Publication Data

US 2012/0038390 A1 Feb. 16, 2012

Related U.S. Application Data

(60) Provisional application No. 61/374,141, filed on Aug. 16, 2010.

(51) Int. Cl.
*H03K 3/356* (2006.01)

(52) U.S. Cl.
USPC ............ 327/208; 327/108; 327/359; 327/218

(58) Field of Classification Search
USPC .......................... 327/208, 218, 359, 108, 259
See application file for complete search history.

(56) References Cited

U.S. PATENT DOCUMENTS

| | | | | |
|---|---|---|---|---|
| 6,407,619 B1 * | 6/2002 | Tanaka | ........................ | 327/536 |
| 7,336,114 B2 * | 2/2008 | Razavi et al. | ................. | 327/199 |
| 7,368,955 B2 * | 5/2008 | Kiziloglu et al. | ............... | 327/51 |
| 7,598,788 B2 * | 10/2009 | Cao | ............................... | 327/266 |
| 2004/0227573 A1 * | 11/2004 | Soda | ............................ | 330/253 |

* cited by examiner

*Primary Examiner* — Quan Tra

(74) *Attorney, Agent, or Firm* — McDermott Will & Emery LLP

(57) ABSTRACT

Improved master latch for high-speed slicer providing enhanced input signal sensitivity. A pre-charging circuit injects charge into the sources of the differential pair of a latch that samples the input signal during odd clock cycles. This reduces the gate-to-source voltage of the sampling pair, making them less sensitive to data bits latched by a second parallel master latch in odd clock cycles. The injected charge dissipates before the sampling pair is needed to fully sample the input signal in even clock cycles. The pre-charging circuit includes a current mirror, a current source and a transistor that couples the current source to the current mirror during odd clock cycles. A shunt peaked amplifier with excess peaking boosts the high-frequency content of a differential input signal relative to its low-frequency content. Capacitors cross-couple the gates and drains of the differential sampling pair. These supply an equal but opposite gate current than supplied by the intrinsic gate-to-drain capacitance, thereby reducing net current to the gate, and jitter on the input signal.

14 Claims, 8 Drawing Sheets

GIGABIT-SPEED SLICER LATCH WITH HYSTERESIS OPTIMIZATION

TECHNICAL FIELD

This application relates to high speed slicer latches, and optimizations to reduce hysteresis in such latches.

BACKGROUND

Typically, the analog front end of a high-speed receiver uses a high-speed slicer circuit that is composed of a front-end master latch and subsequent slave latches. To enable high receiver performance, the high-speed slicer must have high sensitivity to low amplitude input signals.

FIG. 1 is a schematic illustration of a typical master latch 100 for a high-speed slicer circuit. The master latch 100 includes a differential pair of input sampling transistors 112 and 114, a pair of latch transistors 113 and 115, and a transistor 110 configured as a constant current source. The current source 110 can be alternately coupled to the sources of the sampling transistors 112 and 114 through a coupling transistor 116 or to the sources of the latch transistors 113 and 115 through a coupling transistor 117. The drain of sampling transistor 112 is coupled to a power supply through a resistor 105 and an inductor 103, while the drain of sampling transistor 114 is coupled to the power supply through a resistor 106 and an inductor 104. Latch transistors 113 and 115 latch the voltage appearing across the drains of sampling transistors 112 and 114 at points 107 and 108, respectively. Output 107 is cross-coupled to the drain of latch transistor 113 and the gate of latch transistor 115, while output 108 is cross-coupled to the drain of latch transistor 115 and the gate of latch transistor 113.

In operation, the master latch 100 is driven by a pair of clocks 120 and 121 that are 180 degrees out of phase. During a positive phase of clock 120 (negative phase of clock 121), transistor 116 couples current source 110 to the sources of the sampling transistors 112 and 114, while transistor 117 decouples current source 110 from the sources of the latch transistors 113 and 115. Similarly, during a negative phase of clock 120 (positive phase of clock 121), coupling transistor 116 decouples current source 110 from the sources of the sampling transistors 112 and 114, while coupling transistor 117 couples current source 110 to the sources of the latch transistors 113 and 115. Thus, sampling transistors 112 and 114 are sensitive to a pair of differential input signals 101 and 102 only during positive phases of clock 120. When one or both of sampling transistors 112 and 114 are turned on by respective input signals 101 and 102, the total current flowing through either or both transistors is a constant that is determined by the size of current source 110. When input signal 101 is larger than input signal 102, more current flows through transistor 112 than through transistor 114, and the voltage drop across resistor 105 is larger than the voltage drop across resistor 106. As a result, the output voltage across the drain of transistor 114 at point 108 is larger than the output voltage across the drain of transistor 112 at point 107. Conversely, when input signal 101 is smaller than input signal 102, less current flows through transistor 112 than through transistor 114, and the voltage drop across resistor 105 is smaller than the voltage drop across resistor 106. As a result, the output voltage across the drain of transistor 114 at point 108 is smaller than the output voltage across the drain of transistor 112 at point 107. During negative phases of clock 120 (and therefore positive phases of clock 121), latch transistors 113 and 115 latch the output voltages appearing across the drains of sampling transistors 112 and 114 at points 107 and 108, respectively.

SUMMARY

A high speed slicer latch with hysteresis optimization, substantially as shown in and/or described in connection with at least one of the figures, as set forth more completely in the claims.

DETAILED DESCRIPTION

High rate data streams are typically latched in a slicer consisting of one or more stages. At each stage, each of a plurality of latches grabs and stores one or more bits in the data stream. For example, a typical half-rate clocked slicer consists of two master latches 100 (FIG. 1), and each master latch 100 latches every other bit in the data stream at half the rate of the data stream.

Figure 1:
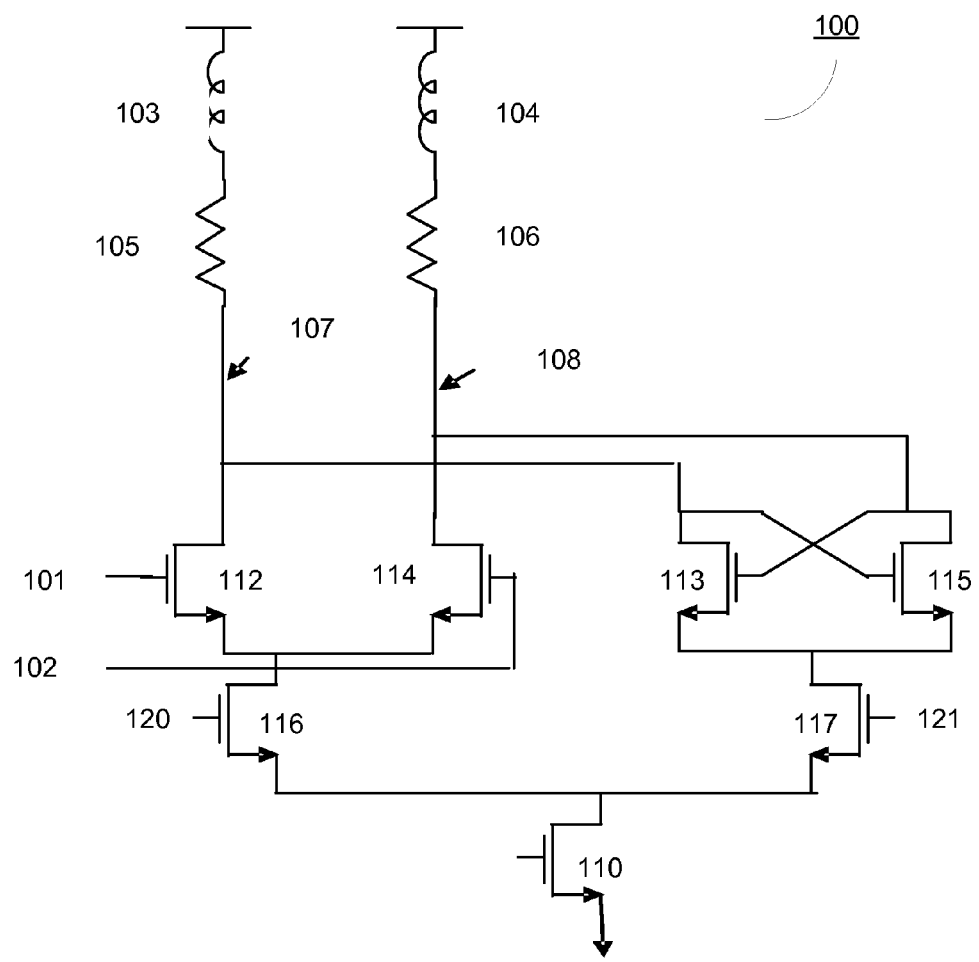
FIG. 1 is a schematic illustration of a typical master latch 100 for a high-speed slicer.
Figure 2:
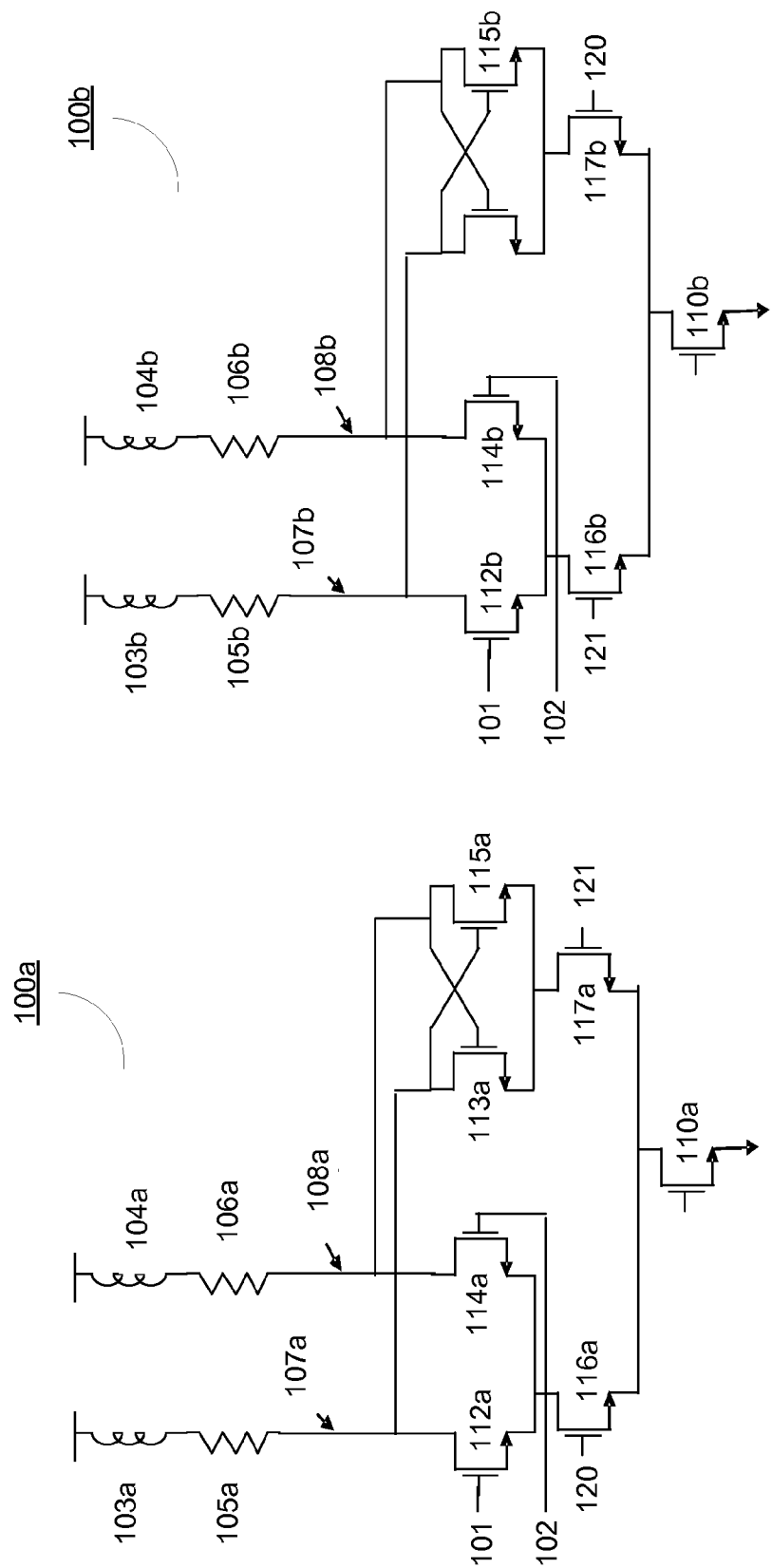
FIG. 2 is a schematic illustration of a half-rate clocked slicer consisting of two master latches of the type shown in FIG. 1.

FIG. 2 is a schematic illustration of a half-rate clocked slicer consisting of two master latches of the type shown in FIG. 1. As shown in FIG. 2, the half-rate clocked slicer 200 consists of two master latches 100a and 100b having the same structure as the master latch 100 shown in FIG. 1. Each master latch 100a and 100b receives the same differential pair of input data signals 101 and 102, and the same pair of out of phase clocks 120 and 121. However, the transistor 116a that couples the sampling transistors 112a and 114a to the current source 110a is driven by clock 120 in master latch 100a, while the transistor 116b that couples the sampling transistors 112b and 114b to the current source 110b is driven by clock 121 in master latch 100b. Similarly, the transistor 117a that couples latch transistors 113a and 115a to current source 110a is driven by clock 121 in master latch 100a, while the transistor 117b that couples latch transistors 113b and 115b to current source 110b is driven by clock 120 in master latch 100b. Thus, differential input data signals 101 and 102 are alternately sampled by master latches 100a/100b during positive phases of clocks 120/121, respectively, and the sampled data are alternately latched by master latches 100a/100b during negative phases of clocks 120/121. This is shown below in reference to FIG. 3.

Figure 3:
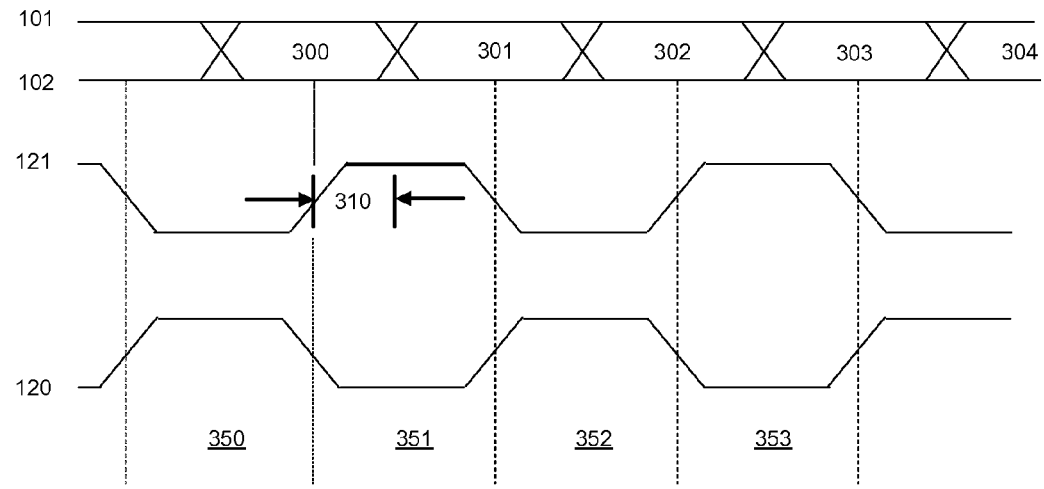
FIG. 3 is a schematic illustration of a timing diagram for the half-rate clocked slicer shown in FIG. 2.

FIG. 3 is a schematic illustration of a timing diagram for the half-rate clocked slicer shown in FIG. 2. As shown in FIG. 3, a stream of input data bits 300 through 303 can be carried by a differential pair of input signals 101 and 102. Even data bits 300 and 302 are latched on the falling edge of a clock 120 by master latch 100a, while odd data bits 301 and 303 are latched on the falling edge of a clock 121 by master latch 100b. As shown in FIG. 3, during a portion 310 of the positive phase of clock 121, master latch 110b is sensitive to and samples the previous data bit 300 before ultimately sampling and latching the current data bit 301 on the falling edge of clock 121. If the input signals 101 and 102 are much larger when they carry data bit 300 than when they carry data bit 301, the sampling transistors 112b and 114b in master latch 100b may not be fast enough or sensitive enough to correctly sample data bit 301. This can contribute to unwanted hysteresis and data sampling errors in the high speed slicer.

Figure 4:
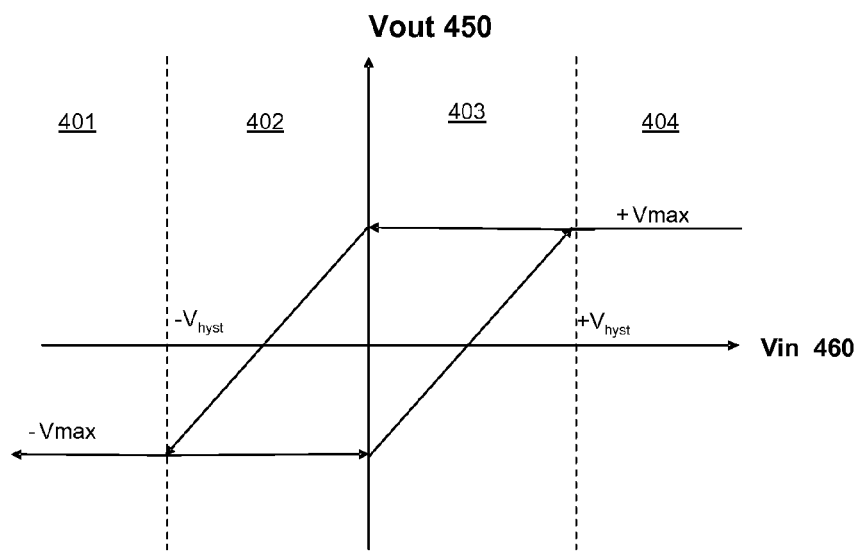
FIG. 4 is a schematic illustration of a hysteresis diagram for a high speed slicer.

FIG. 4 is a schematic illustration of a hysteresis diagram for a high speed slicer. As shown in FIG. 4, the relationship between the output voltage (Vout 450) that is latched by the slicer and the input voltage (Vin 460) that drives the slicer consists of four regions. In a first region 401, where the input voltage is less than a hysteresis voltage (−Vhys), the slicer exhibits ideal behavior and outputs an ideal output voltage (−Vmax). Similarly, in a fourth region 404, where the input voltage is greater than a hysteresis voltage (+Vhys), the slicer again exhibits ideal behavior and outputs an ideal output voltage (+Vmax). However, in the regions 402 and 403 when the magnitude of the input voltage is less than the magnitude of the hysteresis voltage, the slicer's behavior departs from the ideal. For example, in region 402, the slicer can latch a non-ideal output voltage (|Vout|<|Vmax|) that is positive even though the input voltage is negative if the slicer previously latched an ideal output voltage (+Vmax) for a positive input voltage. Likewise, in region 403, the slicer can latch a non-ideal output voltage (|Vout|<|Vmax|) that is negative even though the input voltage is positive if the slicer previously latched an ideal output voltage (Vout=−Vmax) for a negative input voltage. The hysteresis effects exhibited in regions 402 and 403 can lead to errors interpreting the input data stream Vin 460. For example, if negative values of input voltage 460 and output voltage 450 are interpreted to be logical lows (i.e., 0's), and positive values of input voltage 460 and output voltage 450 are interpreted to be logical highs (i.e., 1's), the incorrect latching of a negative input voltage 460 as a positive output voltage 450 in region 402 will result in flipping and incorrectly latching a logical bit 0 as a logical bit 1.

Figure 5:
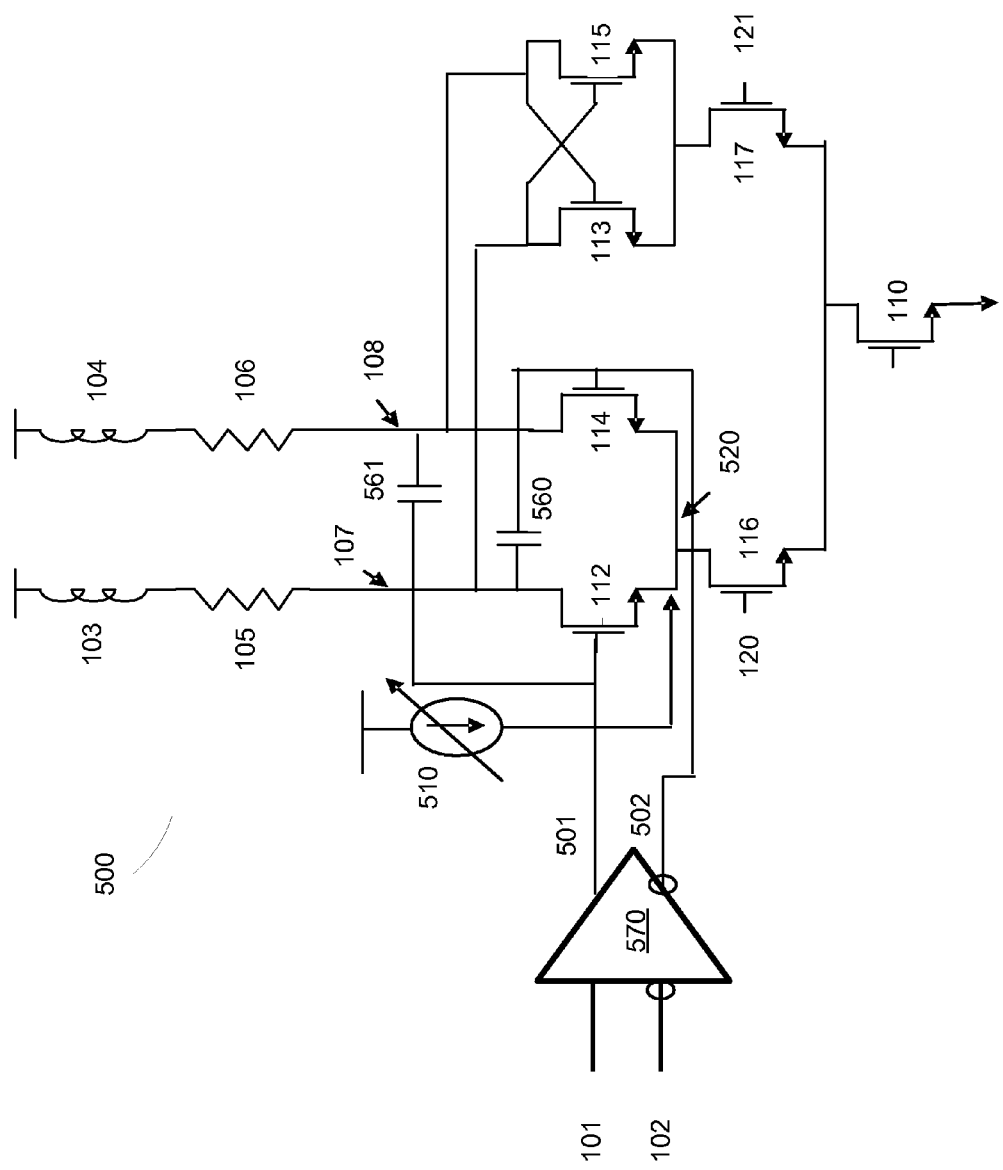
FIG. 5 is a schematic illustration of an improved master latch for a high-speed slicer.

FIG. 5 is a schematic illustration of a master latch 500 for a high-speed slicer having a number of improvements to reduce hysteresis. In particular, master latch 500 includes a pre-charging circuit 510 that reduces the sensitivity of the input sampling transistors 112 and 114 to the effects of a previous data bit (e.g., data bit 300 shown in FIG. 3) when sampling a current data bit (e.g., data bit 301), a set of cross-coupling capacitors 560 and 561 that reduce jitter in input signals 501 and 502 due to the gate-drain capacitance of transistors 112 and 114, respectively, and a shunt-peaked amplifier 570 with excess peaking at higher frequencies that boosts the magnitude of input signals 101 and 102 when these signals are rapidly changing. Each of these improvements is explained below.

A first improvement to master latch 500, is the addition of a shunt peaked amplifier 570 with excess peaking to boost the relative magnitude of differential input signals 101 and 102 when the bit pattern carried by these signals is rapidly changing. As shown in FIG. 5, a shunt-peaked amplifier 570 receives differential input signals 101 and 102, and outputs amplified differential signals 501 and 502. Amplified differential signals 501 and 502 are then used to drive the gates of input sampling transistors 112 and 114 in the improved master latch 500. To the extent the amplified differential signals 501 and 502 exceed the differential hysteresis voltage of the improved master latch 500 (e.g., as shown in FIG. 4), boosting the differential input signals 101 and 102 with shunt peaked amplifier 570 minimizes hysteresis effects of master latch 500. An exemplary shunt peaked amplifier 570 for use in master latch 500 is described below.

Figure 6A:
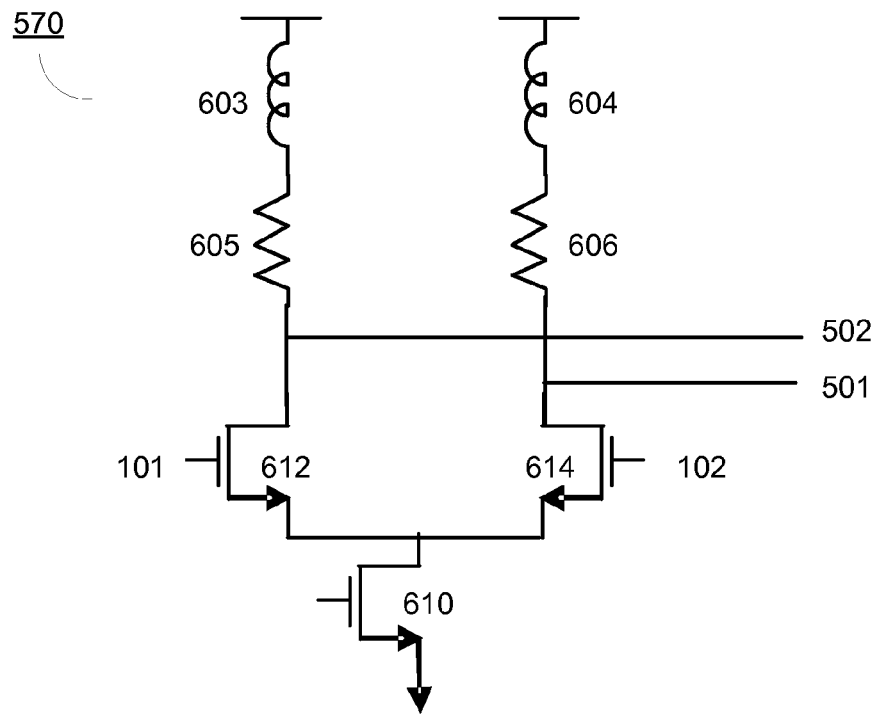
FIG. 6A is a schematic illustration of a differential shunt-peaked amplifier with excess peaking that can be used in the master latch of FIG. 5.

FIG. 6A is a schematic illustration of a differential shunt-peaked amplifier 570 with excess peaking that can be used in the master latch of FIG. 5. The differential shunt-peaked amplifier 570 includes a differential pair of transistors 612 and 614 whose sources are coupled together and to the drain of a transistor 610 that acts as a constant current source. A differential input signal 101 and 102 drives the gates of transistors 612 and 614, respectively. The drain of transistor 612 is coupled to a power supply through a resistor 605 and an inductor 603. The drain of transistor 614 is coupled to the power supply through a resistor 606 and an inductor 604. In operation, the current source transistor 610 ensures that a constant current flows through the two transistors 612 and 614. When the input signal 101 is greater than the input signal 102, more current flows through transistor 612 than through transistor 614, a larger voltage drop appears across resistor 605 than resistor 606, and the output signal 501 at the drain of transistor 614 is larger than the output signal 502 at the drain of transistor 612. Similarly, when the input signal 101 is less than the input signal 102, more current flows through transistor 614 than through transistor 612, a larger voltage drop appears across resistor 606 than resistor 605, and the output signal 502 at the drain of transistor 612 is larger than the output signal 501 at the drain of transistor 614. Thus, the differential output signals 501 and 502 at the drains of transistors 614 and 612, respectively, are amplified versions of the differential input signals 101 and 102 that drive the gates of transistors 612 and 614, respectively.

Figure 6B:
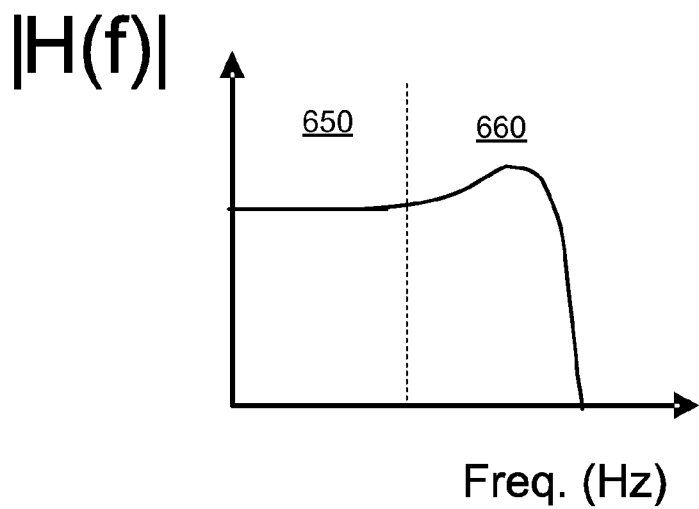
FIG. 6B is a schematic illustration of the frequency response of the shunt peaked amplifier of FIG. 6A.

FIG. 6B is a schematic illustration of the frequency response of the shunt-peaked amplifier of FIG. 6A. As is well known, in a low frequency region 650, the shunt-peaked amplifier 570 has a relatively flat frequency response. This frequency response can generally be extended into a higher frequency region 660 by coupling the drains of transistors 612 and 614 to the power supply through inductors 603 and 604, respectively. Ordinarily, inductors 603 and 604 are sized so that the frequency response of shunt-peaked amplifier 570 is relatively flat in the higher frequency region 660. However, by selecting inductors 603 and 604 with a larger inductance, the frequency response of shunt-peaked amplifier 570 can be peaked in the higher frequency range 660 as shown in FIG. 6B. Thus, when differential input signals 101 and 102 are high frequency (i.e., when the information they carry is rapidly changing), the differential output signals 501 and 502 from shunt-peaked amplifier 570 are amplified to a greater extent than when differential input signals 101 and 102 are low frequency (i.e., when the information they carry is not rapidly changing). This helps to minimize the effects of hysteresis in master latch 500 since, as shown in FIG. 4, hysteresis in master latch 500 only occurs when the input signal Vin 460 switches states and thus has a large high frequency component. Thus, to the extent differential output signals 501 and 502 are amplified beyond the hysteresis voltage of master latch 500, the hysteresis effects from master latch 500 are minimized.

Referring again to FIG. 5, a second improvement to the master latch 500 involves the addition of cross-coupling capacitors 560 and 561 to reduce jitter on the differential input signals 501 and 502. As shown in FIG. 5, cross coupling capacitor 560 is coupled between the drain of transistor 112 and the gate of transistor 114, while cross coupling capacitor 561 is coupled between the drain of transistor 114 and the gate of transistor 112. Together, these cross-coupling capacitors 561 and 560 reduce the amount of jitter on the input signals 501 and 502 seen at the gates of transistors 112 and 114, respectively. For example, during a transition in the data carried by differential input signals 501 and 502, signal 501 will change state in a first direction (e.g., from low to high), while signal 502 changes state in a second and opposite direction (e.g., from high to low). As a result, as explained above, the voltage appearing across the drain of transistor 112 at node 107 will change in the second direction, while the voltage appearing across the drain of transistor 114 at node 108 will change in the first direction. The voltage change in the second direction at node 107 will induce a capacitive current to flow to/from the gate of transistor 112 due to the intrinsic gate-drain capacitance of transistor 112. At the same time, the voltage change in the first direction at node 108 will induce a capacitive current to flow from/to the gate of transistor 112 (i.e., in the opposite direction) due to the presence of cross-coupled capacitor 561. By choosing the capacitance of cross-coupled capacitor 561 to be approximately equal to the gate-drain capacitance of transistor 112, the net current flow to/from the gate of transistor 112 can be reduced, thereby reducing the jitter introduced to input signal 501 due to the drain-gate capacitance of transistor 112.

For the reasons explained above, the cross-coupling capacitor 560 will reduce the jitter introduced to input signal 502 due to the drain-gate capacitance of transistor 114. In particular, the voltage change in the first direction at node 108 will induce a capacitive current to flow from/to the gate of transistor 114 due to the intrinsic gate-drain capacitance of transistor 114. At the same time, the voltage change in the second direction at node 107 will induce a capacitive current to flow to/from the gate of transistor 114 (i.e., in the opposite direction) due to the presence of cross-coupled capacitor 560. By choosing the capacitance of cross-coupled capacitor 560 to be approximately equal to the gate-drain capacitance of transistor 114, the net current flow to/from the gate of transistor 114 can be reduced, thereby reducing the jitter introduced to input signal 502 due to the drain-gate capacitance of transistor 114.

Finally, as shown in FIG. 5, a third improvement to the master latch 500 is the inclusion of a pre-charging circuit 510 to pre-charge the source nodes 520 of the input sampling transistors 112 and 114 in order to reduce their sensitivity to a previous data bit prior to sampling a current data bit. For example, as shown in the timing diagram of FIG. 3, master latch 100b (FIG. 2) samples data bit 301 on the falling edge of clock 121, while master latch 100a samples data bit 300 on the falling edge of clock 120. During a period 310 just prior to sampling data bit 301, sampling transistors 112b and 114b in master latch 100b are sensitive to the size of the input signals 101 and 102 as they convey data bit 300. As discussed above in reference to FIG. 3, if input signals 101 and 102 are much larger while conveying data bit 300 than while conveying data bit 301, sampling transistors 112b and 114b may not be fast enough or sensitive enough to properly sample data bit 301. For this reason, the sensitivity of transistors 112b and 114b to data bit 300 is reduced by injecting charge into the source nodes of transistors 112b and 114b during the half-cycle 350 of clock 121 that they are insensitive to input signals 101 and 102. This injected charge reduces the gate-to-source voltage $V_{gs}$ of transistors 112b and 114b, thereby making them less sensitive to input signals 101 and 102 during the period 310 that signals 101 and 102 convey data bit 300. This injected charge is made small enough that it dissipates through transistor 110b by the end of period 310, thereby leaving transistors 112b and 114b fully sensitive to input signals 101 and 102 during the period signals 101 and 102 convey data bit 301.

Referring back to FIG. 5, current source 510 in master latch 500 is configured to inject charge into the source nodes 520 of transistors 112 and 114 during odd phases of clock 120 when the transistors 112 and 114 are insensitive to input signals 501 and 502 as described above. The injected current reduces the gate-to-source voltage of transistors 112 and 114, thereby making them relatively insensitive to input signals 501 and 502 during the first part of even phases of clock 120 (e.g., similar to period 310 in FIG. 3). However, by the end of the first part of even phases of clock 120, all of the injected current is dissipated through transistor 110, thus leaving transistors 112 and 114 fully sensitive to input signals 501 and 502 while the signals are conveying a data bit to be latched by master latch 500. Details of the current source 510 are discussed below.

Figure 7:
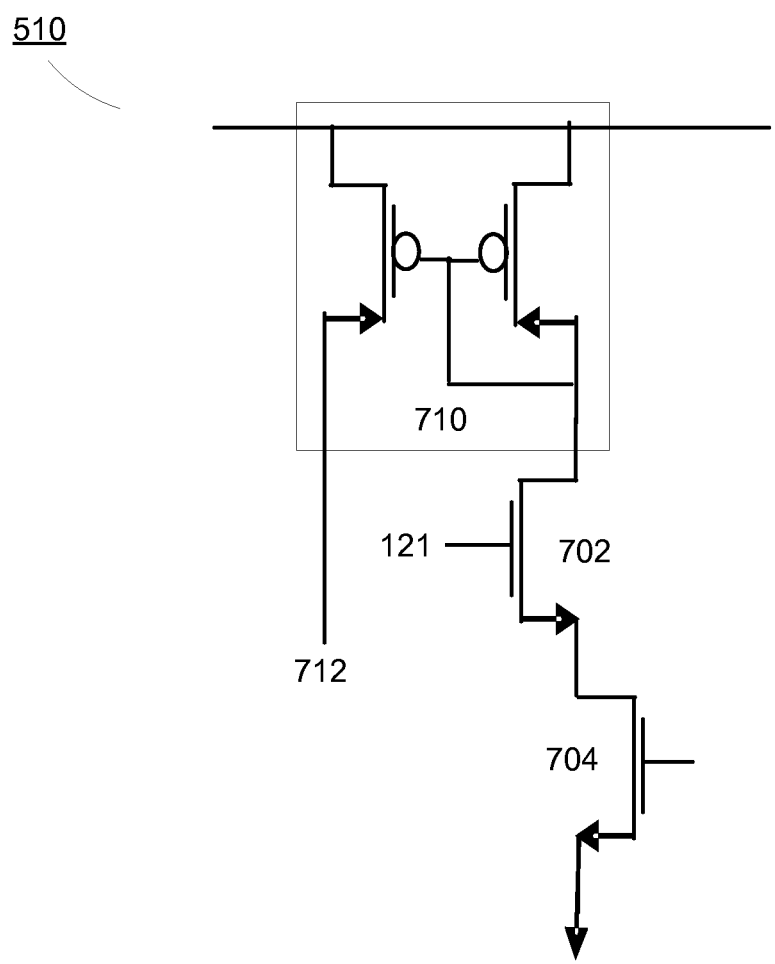
FIG. 7 is a schematic illustration of a pre-charging circuit that can be used in the master latch of FIG. 5

FIG. 7 is a schematic illustration of a pre-charging circuit that can be used in the master latch of FIG. 5. As shown in FIG. 7, the pre-charging circuit 510 includes a current mirror 710, a current source 704 and a coupling transistor 702 that couples the current source 704 to the input leg of the current mirror 710. The output leg of the current mirror produces a current 712 that mirrors the current produced by current source 704. Coupling transistor 702 is driven by a clock 121, and therefore couples current source 704 to the input leg of current mirror 710 only during the even phases of clock 121. If clock 121 is 180 degrees out of phase with a clock 120 as shown in FIG. 3, coupling transistor 702 will therefore couple current source 704 to the input leg of current mirror 710 during odd phases of clock 120 as described above. As a result, a current 712 will be produced at the output leg of the current mirror 710 during odd phases of clock 120. As shown in FIG. 5, this current is then injected into the source 520 of transistors 112 and 114 to reduce their sensitivity to input signals 501 and 502 during the first part of the even phases of clock 120.

As discussed above, pre-charging circuit 510 renders transistors 112 and 114 in master latch 500 less sensitive to odd data symbols (e.g., symbols 301 and 303 in FIG. 3), prior to sampling and latching even data symbols (e.g., symbols 302 and 304). Master latch 500 is thus preferably used as a master latch 500a in a half-rate clocked slicer with an identical second master latch 500b that samples odd data symbols with reduced sensitivity to even data symbols. Such an embodiment is described below.

Figure 8:
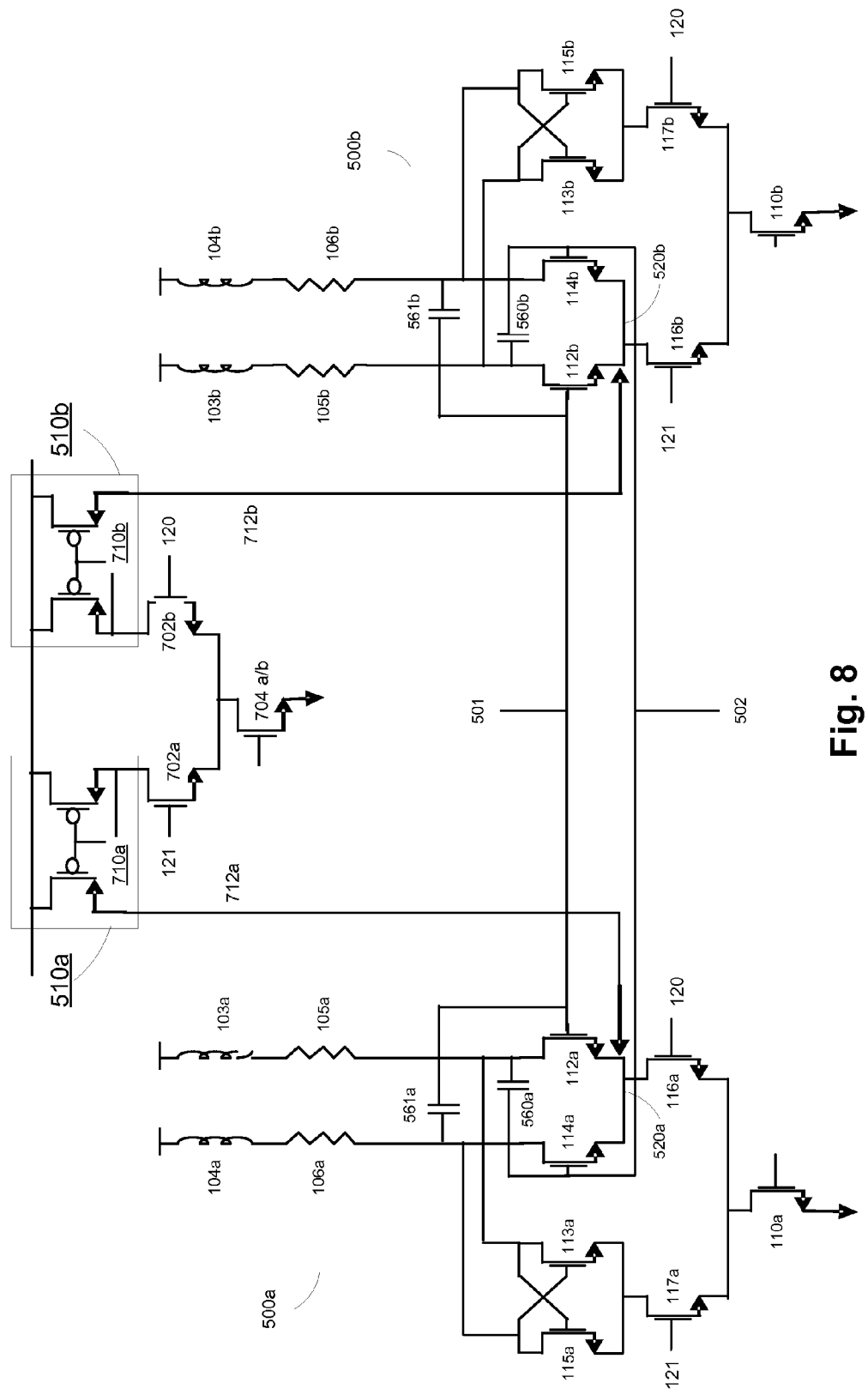
FIG. 8 is a schematic illustration of a half-rate clocked slicer consisting of two master latches of the type shown in FIG. 5 using the pre-charging circuit shown in FIG. 7.

FIG. 8 is a schematic illustration of a half-rate clocked slicer consisting of two master latches of the type shown in FIG. 5 using the pre-charging circuit shown in FIG. 7. For convenience, the shunt-peaked amplifier 570 shown in FIGS. 5 and 6A is not shown in FIG. 8. Rather, the output signals 501 and 502 produced by the amplifier 507 are shown. Each master latch 500a and 500b in the half-rate clocked slicer alternately samples and latches the even/odd data bits conveyed by a differential input signal 501 and 502, with a reduced sensitivity to the odd/even data bits conveyed by the signals 501 and 502.

As further shown in FIG. 8, master latch 500a contains a differential pair of sampling transistors 112a and 114a, and a differential pair of latching transistors 113a and 115a. The sampling transistors 112a and 114a are coupled to a current source 110a through a coupling transistor 116a, while the pair of latching transistors 113a and 115a are coupled to the current source 110a through a coupling transistor 117a. During even phases of clock 120/odd phases of clock 121, master latch 500a uses sampling transistors 112a and 114a to sample a differential pair of input signals 501 and 502, while during odd phases of clock 120/even phases of clock 121 master latch 500a uses latching transistors 113a and 115a to latch the sampled signals. Thus, master latch 500a latches even symbols in a data stream carried by differential input signals 501 and 502.

To reduce the sensitivity of sampling transistors 112a and 114a to the odd symbols carried by input signals 501 and 502, current from a pre-charging circuit 510a is injected into the sources 520a of transistors 112a and 114a during odd phases of clock 120 as described above. Consequently, the coupling transistor 702a that couples the current source 704 a/b to the input leg of current mirror 710a in pre-charging circuit 510a is driven by clock 121. When clock 121 is in an even phase, clock 120 is in an odd phase, and pre-charging circuit 510a injects current 712a into the sources 520a of sampling transistors 114a and 112a as described above to reduce the sensitivity of the sampling transistors to the odd symbols carried by input signals 501 and 502.

To reduce jitter on input signals 501 and 503 as explained above, master latch 500a uses capacitor 560a to cross couple the drain of transistor 112a to the gate of transistor 114a, and uses capacitor 561a to cross couple the drain of transistor 114a to the gate of transistor 112a. The cross coupling capacitors 560a and 561a provide an additional source of capacitive current to the gates of transistors 114a and 112a, respectively, which is of the same magnitude but opposite in polarity to the capacitive current produced at the gates of these transistors due to their intrinsic gate-to-drain capacitances. As a result, the net capacitive current at the gates of transistors 112a and 114a is reduced, thus reducing the jitter of input signals 501 and 502.

In a completely similar and complimentary manner, master latch 500b contains a differential pair of sampling transistors 112b and 114b, and a differential pair of latching transistors 113b and 115b. The sampling transistors 112b and 114b are coupled to a current source 110b through a coupling transistor 116b, while the pair of latching transistors 113b and 115b are coupled to the current source 110b through a coupling transistor 117b. During even phases of clock 121/odd phases of clock 120, master latch 500b uses sampling transistors 112b and 114b to sample the differential pair of input signals 501 and 502, while during odd phases of clock 121/even phases of clock 120 master latch 500b uses latching transistors 113b and 115b to latch the sampled signals. Thus, master latch 500b latches odd symbols in a data stream carried by differential input signals 501 and 502.

To reduce the sensitivity of sampling transistors 112b and 114b to the even symbols carried by input signals 501 and 502, current from a pre-charging circuit 510b is injected into the sources 520b of transistors 112b and 114b during odd phases of clock 121 as described above. Consequently, the coupling transistor 702b that couples the current source 704 a/b to the input leg of current mirror 710b in current source 510b is driven by clock 120. When clock 120 is in an even phase, clock 121 is in an odd phase, and pre-charging circuit 510b injects current 712b into the sources 520b of sampling transistors 114b and 112b as described above to reduce the sensitivity of the sampling transistors to the even symbols carried by input signals 501 and 502.

To reduce jitter on input signals 501 and 503, master latch 500b uses capacitor 560b to cross couple the drain of transistor 112b to the gate of transistor 114b, and uses capacitor 561b to cross couple the drain of transistor 114b to the gate of transistor 112b. The cross coupling capacitors 560b and 561b provide an additional source of capacitive current to the gates of transistors 114b and 112b, respectively, which is of the same magnitude but opposite in polarity to the capacitive current produced at the gates of these transistors due to their intrinsic gate-to-drain capacitances. As a result, the net capacitive current at the gates of transistors 112b and 114b is reduced, thus reducing the jitter of input signals 501 and 502.

Figure 9A:
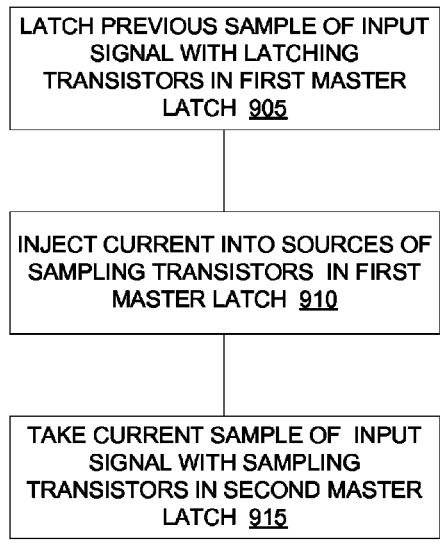
FIGS. 9A and 9B are flowcharts illustrating a method of processing data received at the two master latches of a half-rate clocked slicer.
Figure 9B:
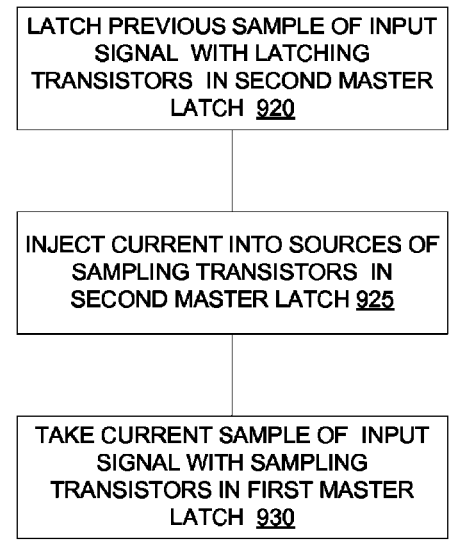

FIGS. 9A and 9B are flowcharts illustrating a method of processing data received in the master latches of a half-rate clocked slicer. The half-rate clocked slicer can be, for example, the slicer shown in FIG. 8 consisting of master latches 500a and 500b, and pre-charging circuits 510a and 510b. FIG. 9A illustrates the processing steps that occur during the odd phases of a slicer clock, such as clock 120, while FIG. 9B illustrates the processing steps that occur during the even phases of the slicer clock.

As shown in FIG. 9A, during odd phases of a slicer clock, the method involves latching a previous sample of an input signal with the latching transistors of a first master latch (905), while simultaneously injecting current into the sources of the sampling transistors in the first master latch (910) and taking a current sample of the input signal with the sampling transistors of the second master latch (915). For example, as shown in FIG. 8, during odd phases of slicer clock 120 (even phases of slicer clock 121), latching transistors 113a and 115a in master latch 500a latch a sample of differential input signal 501/502 previously taken by sampling transistors 112a and 114a (e.g., the sample taken in step 930 of FIG. 9B during the previous even phase of slicer clock 120). At the same time, pre-charging circuit 510a injects a current into the sources of sampling transistors 112a and 114a, and sampling transistors 112b and 114b of master latch 500b take a current sample of differential input signals 501/502. This current sample of input signals 501/502 will be latched by the latching transistors in master latch 500b during the next transition between the odd and even phases of clock 120 (e.g., at step 920 in FIG. 9B). Note that all of the actions shown in FIG. 9A occur at the same time, during odd phases of slicer clock 120 (even phases of slicer clock 121). Thus, while the first master latch 500a is latching the previous sample of the input data stream and is pre-charging its sampling transistors in anticipation of taking the next sample of the data stream, the second master latch 500b is taking a current sample of the data stream. As a result, as the slicer clocks 120/121 transition between their even and odd phases, the master latches 500a and 500b alternate their sampling and latching roles in order to latch both even and odd data bits in the input data stream 501/502.

As shown in FIG. 9B, during even phases of the slicer clock, the roles played by master latches 500a and 500b are reversed. Thus, the method involves latching a previous sample of the input signal with the latching transistors of the second master latch (920), while simultaneously injecting current into the sources of the sampling transistors in the second master latch (925), and taking a current sample of the input signal with the sampling transistors of the first master latch (930). For example, as shown in FIG. 8, during even phases of slicer clock 120 (odd phases of slicer clock 121), latching transistors 113b and 115b in master latch 500b latch a sample of differential input signal 501/502 previously taken by sampling transistors 112b and 114b (e.g., the sample taken in step 915 of FIG. 9A during the previous odd phase of slicer clock 120). At the same time, pre-charging circuit 510*b* injects a current into the sources of sampling transistors 112*b* and 114*b*, and sampling transistors 112*a* and 114*a* of master latch 500*a* take a current sample of differential input signals 501/502. This current sample of input signals 501/502 will be latched by the latching transistors in master latch 500*a* during the next transition between the even and odd phases of clock 120 (e.g., at step 905 in FIG. 9A). As before, all of the actions shown in FIG. 9B occur at the same time during even phases of slicer clock 120 (odd phases of slicer clock 121). Thus, while the second master latch 500*b* is latching the previous sample of the input data stream and is pre-charging its sampling transistors in anticipation of taking the next sample of the data stream, the first master latch 500*a* is taking a current sample of the data stream. As a result, as the slicer clocks 120/121 transition between their even and odd phases, the master latches 500*a* and 500*b* alternate their sampling and latching roles in order to latch both even and odd data bits in the input data stream 501/502.

As discussed above, the method described in FIGS. 9A and 9B makes each of the master latches in a half-rate slicer less sensitive to the input data stream when the master latches are not actively sampling the data stream by injecting a charge into the sources of the sampling transistors. The injected charge makes the sampling transistors more sensitive to the input data stream during phases of the slicer clock when the master latches are actively sampling the data stream.

While certain features of the described implementations have been illustrated as described herein, various modifications, substitutions, changes and equivalents will be known to those skilled in the art. For example, while the various circuits described herein have been shown and described as differential circuits, it will be apparent to one of skill in the art that the differential circuits described can also be implemented as single ended circuits.

It is, therefore understood that the following claims are intended to cover all such modifications and changes as fall within the scope of the embodiments described herein.

What is claimed is:

1. A high speed slicer, comprising:
    a master and a slave slicer circuit controlled by first and second clock signals that represent odd and even phases of a slicer clock signal;
    a pre-charging circuit including a first pre-charging circuit and a second pre-charging circuit, the first and the second pre-charging circuit configured to respectively pre-charge the master and slave slicer circuits, wherein the first and the second pre-charging circuit are enabled by a differential amplifier that receives the first and second clock signals, respectively;
    the master slicer circuit comprising:
        a first pair of sampling transistors, configured to be enabled by the second clock signal to sample a differential input signal, wherein the first pair of sampling transistors include a first sampling transistor and a second sampling transistor;
        a first pair of latching transistors, configured to be enabled by the first clock signal to latch the differential input signal sampled by the first pair of sampling transistors;
        a first cross-coupled capacitor, coupled between the drain of the first sampling transistor and the gate of the second sampling transistor; and
        a second cross-coupled capacitor, coupled between the drain of the second sampling transistor and the gate of the first sampling transistor;
    the first pre-charging circuit, configured to inject current into the sources of the first pair of sampling transistors when enabled by the first clock signal, the first pre-charging circuit including:
        a first current source shared between the first and the second pre-charging circuits;
        a first current mirror having an input leg and an output leg, wherein the output leg of the first current mirror is configured to inject current into the sources of the first pair of sampling transistors.

2. The high speed slicer of claim 1, further comprising a shunt-peaked amplifier with excess peaking configured to generate the differential input signal sampled by the first pair of sampling transistors by amplifying a received differential signal, wherein the shunt-peaked amplifier is configured to amplify a high frequency component of the received differential signal with a first gain and a low frequency component of the received differential signal with a second gain that is lower than the first gain.

3. The high speed slicer of claim 1, wherein the slave slicer circuit comprises:
    a second pair of sampling transistors, configured to sample the differential input signal on odd phases of the slicer clock;
    a second pair of latching transistors, configured to latch the differential input signal sampled by the second pair of sampling transistors; and
    a second pre-charging circuit, configured to inject current into the sources of the second pair of sampling transistors during even phases of the slicer clock.

4. The high speed slicer of claim 3, wherein the second pre-charging circuit further comprises:
    a second current source;
    a second current mirror having an input leg and an output leg, wherein the output leg of the second current mirror is configured to inject current into the sources of the second pair of sampling transistors; and
    a second coupling transistor coupled between the second current source and the input leg of the second current mirror; wherein a gate of the second coupling transistor receives a signal to drive the second coupling transistor into a conducting state during even phases of the slicer clock.

5. The high speed slicer of claim 3, wherein the second pair of sampling transistors include a third sampling transistor and a fourth sampling transistor, further comprising:
    a third cross-coupled capacitor, coupled between the drain of the third sampling transistor and the gate of the fourth sampling transistor and having a capacitance that is equal to the gate-to-drain capacitance of the third sampling transistor; and
    a fourth cross-coupled capacitor, coupled between the drain of the fourth sampling transistor and the gate of the third sampling transistor and having a capacitance that is equal to the gate-to-drain capacitance of the fourth sampling transistor.

6. The high speed slicer of claim 5, further comprising a shunt-peaked amplifier with excess peaking configured to generate the differential input signal sampled by the first pair of sampling transistors by amplifying a received differential signal, wherein the shunt-peaked amplifier is configured to amplify a high frequency component of the received differential signal with a first gain and a low frequency component of the received differential signal with a second gain that is lower than the first gain.

7. The high speed slicer of claim 1, wherein the capacitance of the first cross-coupled capacitor is equal to the gate-todrain capacitance of the first sampling transistor, and the capacitance of the second cross-coupled capacitor is equal to the gate-to-drain capacitance of the second sampling transistor.

8. The high speed slicer of claim 1, wherein the capacitance of the first cross-coupled capacitor is equal to the gate-to-drain capacitance of the first sampling transistor, and the capacitance of the second cross-coupled capacitor is equal to the gate-to-drain capacitance of the second sampling transistor.

9. The high speed slicer of claim 1, wherein the first and the second cross-coupled capacitors are configured to reduce jitter in the differential input signal.

10. A method for providing a high speed slicer, the method comprising:
providing a pre-charging circuit including a first pre-charging circuit and a second pre-charging circuit;
configuring the first and the second pre-charging circuit to respectively precharge a master and a slave slicer circuit, wherein the first and the second pre-charging circuit are enabled by a differential amplifier that receives a first and a second clock signal, respectively;
providing a master slicer circuit by:
configuring a first pair of sampling transistors to be enabled by the second clock signal to sample a differential input signal, wherein the first pair of sampling transistors include a first sampling transistor and a second sampling transistor;
configuring a first pair of latching transistors to be enabled by the first clock signal to latch the differential input signal sampled by the first pair of sampling transistors; and
configuring the first pre-charging circuit to inject current, when enabled by the first clock signal, into the sources of the first pair of sampling transistors to reduce hysteresis by reducing the sensitivity of the first pair of sampling transistors to effects of a previous data bit, wherein the first pre-charging circuit is provided by:
coupling a first current source to be shared between the first and the second pre-charging circuits,
coupling a first current mirror having an input leg and an output leg, and
configuring the output leg of the first current mirror to inject current into the sources of the first pair of sampling transistors.

11. The method of claim 10, further comprising:
coupling a first cross-coupled capacitor between the drain of the first sampling transistor and the gate of the second sampling transistor; and
coupling a second cross-coupled capacitor between the drain of the second sampling transistor and the gate of the first sampling transistor.

12. The method of claim 10, further comprising providing a shunt-peaked amplifier with excess peaking, configuring the shunt-peaked amplifier to generate the differential input signal sampled by the first pair of sampling transistors by amplifying a received differential signal, and configuring the shunt-peaked amplifier to amplify a high frequency component of the received differential signal with a first gain and a low frequency component of the received differential signal with a second gain that is lower than the first gain.

13. The method of claim 12, wherein providing the shunt-peaked amplifier comprises proving a pair of transistors, each of the transistors having a gate, a source, and a drain, coupling the sources of the pair of transistors together, driving the gates of the pair of transistors by the received differential signal, and coupling the drains of the pair of transistors respectively to a power supply through a pair of inductors.

14. A high speed slicer, comprising:
a pre-charging circuit including a first pre-charging circuit and a second pre-charging circuit, the first and the second pre-charging circuit configured to respectively precharge a master and a slave slicer circuit, wherein the first and the second pre-charging circuit are enabled by a differential amplifier that receives a first and a second clock signal, respectively;
the master slicer circuit comprising:
a first pair of sampling transistors, configured to be enabled by the second clock signal to sample a differential input signal, wherein the first pair of sampling transistors include a first sampling transistor and a second sampling transistor;
a first pair of latching transistors, configured to be enabled by the first clock signal to latch the differential input signal sampled by the first pair of sampling transistors,
wherein the first pre-charging circuit includes a first current mirror having an input leg and an output leg, and wherein the output leg of the first current mirror is configured to inject current into the sources of the first pair of sampling transistors when enabled by the first clock signal.

* * * * *